United States Patent [19]

Lee

[11] 4,354,250
[45] Oct. 12, 1982

[54] SWITCHED-CAPACITOR SOURCE RESISTOR SIMULATION CIRCUIT

[75] Inventor: Man S. Lee, Belmont, Calif.

[73] Assignee: GTE Automatic Electric Laboratories, Inc., Northlake, Ill.

[21] Appl. No.: 177,026

[22] Filed: Aug. 11, 1980

[51] Int. Cl.³ .............................................. G06G 7/48
[52] U.S. Cl. .................................... 364/802; 364/861
[58] Field of Search ................ 364/802, 825, 826, 861

[56] References Cited

U.S. PATENT DOCUMENTS 4,244,030  1/1981  Albarello .......................... 364/825

OTHER PUBLICATIONS

Bocic: Sampled-Data Filters with Switched Capacitors, Int. Journal Electronics, 1979, vol. 47, No. 6, pp. 537-543.
Temes et al., Switched-Capacitor Filter Design Using the Bilinear z-Transform, IEEE Transactions on Circuits and Systems, vol. CAS 25, No. 12, Dec. 1978, pp. 1039-1044.
Fettweis: Principles of Switched-Capacitor Filters, Archiv fur Elektronik und Uebertragungstechnik, vol. 33, No. 1, 1979, pp. 13-19.
Man Shek Lee: Switched-Capacitor Filters using Floating-Inductance Simulation Circuits, Electronics Letters, Sep. 27, 1979, vol. 15, No. 20, pp. 644-645.
Man Shek Lee: Improved Circuit Elements For Switched-Capacitor Ladder Filters, Electronics Letters, Feb. 14, 1980, vol. 16, No. 4, pp. 131-133.

*Primary Examiner*—Felix D. Gruber
*Attorney, Agent, or Firm*—Russell A. Cannon

[57] ABSTRACT

An integrated circuit comprising first and second nodes that are connected to external circuitry, a voltage follower having input and output terminals electrically connected between the second node and the bottom plate of a first integrated capacitor C1, and second and third integrated capacitors C2 and C3 having the bottom plates thereof connected to a ground reference potential. A switch means is operative for periodically electrically connecting the top plate of C1 to the first and second nodes during first and second non-overlapping time periods in each time interval T for discharging C1 and charging C1 to the difference voltage across the nodes, respectively, where T is the time interval between adjacent second time periods and $f = 1/T$ is the switching frequency for C1. The switch means also operates for periodically electrically connecting the top plates of C2 and C3 to the second and first nodes. The circuit simulates a source resistor when the first node is electrically connected to the output terminal of a voltage source that is connected to ground. This circuit configuration simulates a bilinear source resistor when the capacitances of C1, C2 and C3 are the same values, and the circuit is characterized by the bilinear transformation.

15 Claims, 2 Drawing Figures

SWITCHED-CAPACITOR SOURCE RESISTOR SIMULATION CIRCUIT

BACKGROUND OF THE INVENTION

This invention relates to switched capacitor circuits or networks and more particularly to a switched capacitor circuit replacement for a source resistor.

There is currently much interest in the simulation of resistors with switched capacitor circuits so that filters and networks can be implemented in fully integrated circuit form. Switched capacitor source resistors are particularly useful in LC ladder filters. Switched capacitor source resistors are generally described in the references "Switched-Capacitor Filters Using Floating-Inductance Simulation Circuits" by M. S. Lee, Electronics Letters, Sept. 27, 1979, Vol. 15, No. 20, pages 644–645; "Switched-Capacitor Filter Design Using the Bilinear z-Transform" by G. C. Temes, et al., IEEE Transactions on Circuits and Systems, Vol. 25, No. 12, December, 1978, Pages 1039–1044; and "Basic Principles of Switched-Capacitor Filters Using Voltage Inverter Switches", by A. Fettweis, AEU, 1979, Vol. 33, Pages 13–19.

A number of previously existing switched-capacitor resistors that are useful as source resistors have a direct connection of a capacitor between input and output terminals thereof at some time during a cycle of operation. This provides feedthrough of an analog input signal directly to the output of the simulated resistor which degrades the operation of a discrete-time filter connected to it. This condition has been overcome in the past by inserting a separate sample-hold circuit before the circuit that simulates the source resistor. In the past, this has necessitated multiple circuits with the requisite active and passive elements thereof.

An object of this invention is the provision of an improved switched-capacitor source resistor. Another object is the provision of a switched-capacitor circuit that simultaneously simulates a source resistor and performs a sample-hold function on analog input signals.

SUMMARY OF THE INVENTION

In accordance with this invention, an integratable switched-capacitor circuit for simulating a source resistor across first and second nodes thereof, when the first node is electrically connected to the output terminal of a voltage source that is associated with a ground reference potential, comprises: voltage follower means having an input terminal electrically connected to the second node, which is adapted for connection to external circuitry, and an output terminal electrically connected to one terminal of a first capacitor means C1; a second capacitor means C2 having one terminal electrically connected to ground; and switch means operative for periodically electrically connecting the other side of C1 to the first and second nodes during first and second non-overlapping time periods in successive time intervals T for discharging C1 and charging C1 to the difference voltage across the nodes, where T is the time interval between adjacent terminations of successive second time periods and f=1/T is the switching frequency for C1. The switch means also operates to periodically connect the top plate of C2 to the second and first nodes during non-overlapping time periods in alternate time intervals T for discharging C2 into the second node and charging C2 to the source voltage, respectively. In an alternate embodiment of this invention comprising a third capacitor means C3 having one side electrically connected to ground, the switch means also operates to periodically electrically connect the top plate of C3 to the second and first nodes during non-overlapping time periods in alternate time intervals T (which are different time intervals T from those in which C2 is charged and discharged), for discharging C3 into the second node and charging C3 to the source voltage, respectively. The circuit simulates a bilinear source resistor when the capacitances of C1, C2 and C3 are the same values and the circuit is characterized by the bilinear transformation.

DESCRIPTION OF DRAWING

This invention will be more fully understood from the following detailed description of preferred embodiments thereof, together with the drawing in which.

DESCRIPTION OF PREFERRED EMBODIMENTS

This invention is described in the article "Improved Circuit Elements for Switched-Capacitor Ladder Filter" by M. S. Lee, Electronics Letters, Feb. 14, 1980, Vol. 16, No. 4, Pages 131–133, which is incorporated herein by reference.

Figure 1:
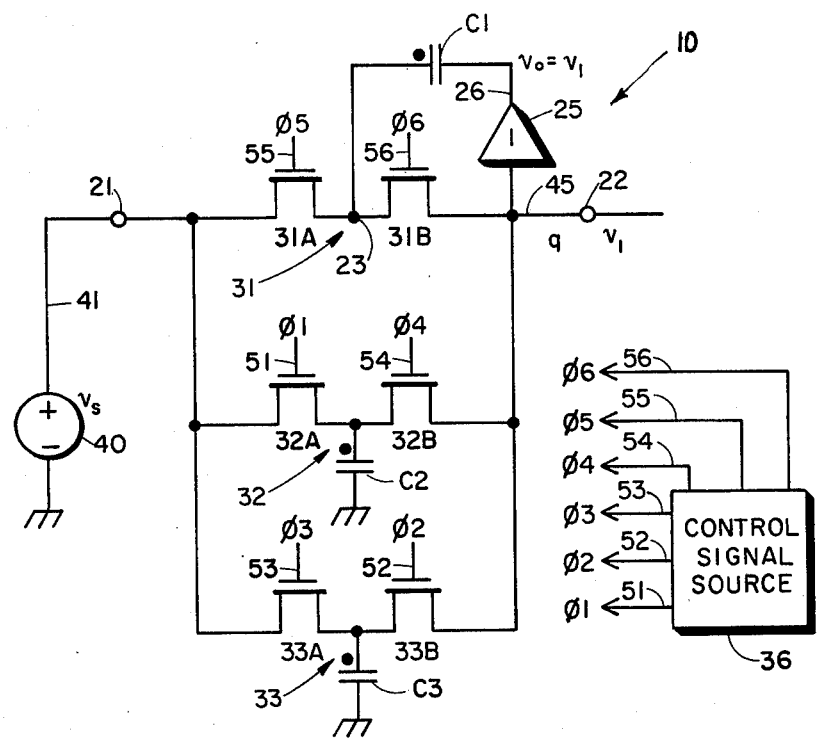
FIG. 1 is a schematic circuit diagram of a preferred embodiment of this invention for implementation in integrated circuit form.

Referring now to a preferred embodiment of this invention in FIG. 1 that is implemented in integrated circuit form, a switched capacitor circuit or network 10 for simulating a source resistor across a pair of terminals or nodes 21 and 22 thereof comprises: a voltage follower 25; integrated capacitors C1, C2 and C3; first, second and third switch means 31, 32 and 33 which are associated with the integrated capacitors C1, C2 and C3, respectively; and a source 36 of timing control signals. The dots on the integrated capacitors indicate the top plates thereof. The voltage follower 25 is essentially a unity gain amplifier that is a voltage-controlled voltage source having a very high input impedance and a very low output impedance. Since the input terminal of amplifier 25 is connected to the node 22, the voltage vl(t) there is also available at the output terminal 26. The bottom plate of the integrated capacitor C1 is directly electrically connected to only the output terminal of the voltage follower. The bottom plate parasitic capacitance of C1 does not change the output voltage of this amplifier, because the output impedance is substantially zero ohms. Thus, the circuit 10 is substantially insensitive to the bottom plate parasitic capacitance effects associated with C1. The bottom plates of integrated capacitors C2 and C3 are directly electrically connected to a ground reference potential for a similar reason, which makes the circuit 10 insensitive to the bottom plate parasitic capacitance effects of the integrated capacitors.

The input node 21 of the simulation circuit 10 is connected to the output terminal 41 of a voltage source 40 that has a very low output impedance, provides whatever output current is demanded by external circuitry, and is associated with the ground reference potential. In many applications, the output node 22 of the simulation circuit is connected to the input terminal of a switched-capacitor implementation of a single section ladder filter, for example, comprising a series inductor having capacitors connected between opposite sides thereof and ground. A load resistor is connected across the output capacitor of such a filter section.

In an embodiment of the circuit 10 that was implemented with MOS technology, each of the switch means 31-33 comprises a pair of MOS FET transistors that are connected in series between the nodes 21 and 22. The intermediate terminal of each pair of transistors is connected to the top plate of an associated one of the integrated capacitors C1, C2 and C3. The gate electrodes of the transistors are driven by ones of the timing control signals $\phi 1-\phi 6$ from the source 36. When the control signal on the gate electrode of a transistor is positive, the FET conducts and operates as a closed switch. Conversely, when the control signal on a gate electrode is low, the FET is non-conducting or cut off and operates as an open switch.

Figure 2:
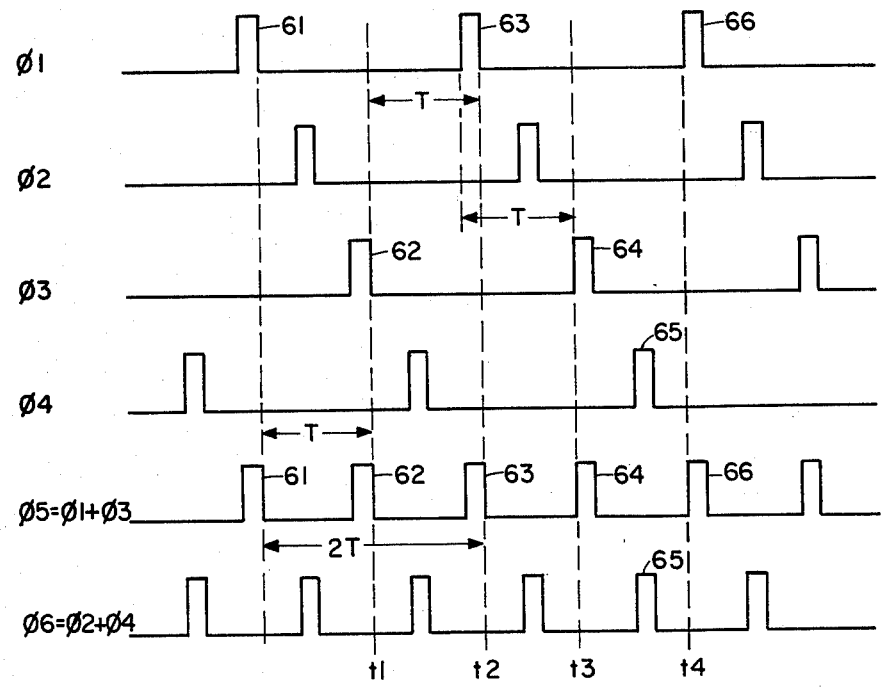
FIG. 2 is timing control signal waveforms for driving integrated switching transistors in FIG. 1.

The source 36 provides six different digital timing control signals $\phi 1-\phi 6$ on lines 51-56, respectively. Only the control signals $\phi 1$ and $\phi 4$ are applied to the gate electrodes of associated transistors 32A and 32B. Similarly, the individual control signals $\phi 3$ and $\phi 2$ are applied to the gate electrodes of transistors 33A and 33B, respectively. The signal $\phi 5$ is actually the sum of the signals $\phi 1$ and $\phi 3$, whereas $\phi 6$ is the sum of the signals $\phi 2$ and $\phi 4$. In practice therefore, the source 36 need only produce four digital control signals. The signals $\phi 1$ and $\phi 3$ are then both applied to line 55. Similarly, both of the control signals $\phi 2$ and $\phi 4$ are applied to line 56. The signals $\phi 5$ and $\phi 6$, however, are useful in illustrating and explaining the operation of this invention. These digital control signals $\phi 5$ and $\phi 6$ contain non-overlapping pulses that are essentially 180° out-of-phase with respect to each other in that one is low when the other is high, as is illustrated in FIG. 2. The duty cycles of $\phi 5$ and $\phi 6$ are normally only slightly less than 50% to provide maximum settling time for these signals. The switching frequency of $\phi 5$ and $\phi 6$ is $f = 1/T$ where $f$ is greater than the Nyquist rate and T is the period of a switching cycle associated with C1. The time interval T is measured between the negative going edges of successive positive pulses in $\phi 5$ which determine the sampled voltage in an associated switched capacitor.

In operation, transistor 31A conducts for connecting the top plate of C1 to the voltage source each time the control voltage in $\phi 5$ is high. During these time periods, the control signal $\phi 6$ is low for maintaining the associated transistor 31B non-conducting for maintaining an open circuit between the output node 22 and the node 23, which is now connected to input node 21. This enables C1 to charge through the voltage follower to the difference voltage v1-$v_s$ across the nodes 21 and 22. It will be noted that it is on termination of a positive pulse in $\phi 5$, such as at time t1, that C1 actually holds the source voltage. During portions of alternate half cycles of the control signals $\phi 5$ and $\phi 6$, the transistors 31B and 31A are conducting and non-conducting for connecting the top plate of C1 to node 22 for discharging it through external circuitry connected to this node, such as an active integrator comprising a differential input operational amplifier having its non-inverting input grounded. This operation of the switch means 31 in periodically charging and discharging C1 every T seconds causes an electrical charge to flow in line 45.

The transistors 32A and 32B are responsive to the signals $\phi 1$ and $\phi 4$, respectively, having a repetition rate of half that of the signals $\phi 5$ and $\phi 6$, i.e., the signals $\phi 1$ and $\phi 4$ repeat every 2T seconds. The transistor 32A conducts for charging C2 to the supply voltage $v_s$ only when $\phi 1$ is high, the sample voltage on C2 being established at termination of a positive pulse such as at time t2. Both of the transistors 32A and 32B are then non-conducting for a time interval T, after which transistor 32B is responsive to a positive pulse in $\phi 4$ for discharging C2 into external circuitry connected to node 22. In a similar manner, transistor 33A conducts for charging C3 to the supply voltage when the control voltage $\phi 3$ is high, the sample voltage on C3 also being established on termination of an enabling pulse such as at time t1. The capacitor C3 also holds the sample voltage for a time interval T prior to transistor 33B conducting in response to a subsequent enabling pulse in $\phi 2$ for discharging it into node 22. This operation of the switch means 31, 32 and 33 for periodically charging and discharging the associated capacitors C1, C2 and C3 causes the circuit 10 to simulate a source resistor across nodes 21 and 22. The simulated source resistor in FIG. 1 is substantially insensitive to bottom plate parasitic capacitance effects associated with the integrated capacitors since their bottom plates are either connected to ground or to the output of a voltage source. Parasitic capacitance effects associated with top plates is small and can be neglected in most instances.

It is necessary that the circuit 10 not provide feedthrough of the input voltage $v_s$ to the output node 22. Consideration of the circuit 10 reveals that there is no direct connection between nodes 21 and 22. Reconsideration of the operation of this circuit also reveals that at least one of the transistors of each switch means is always non-conducting. This prevents a direct connection being momentarily made between the input and output nodes. Stated differently, there may never be an overlap of the positive pulses in $\phi 5$ and $\phi 6$, such as would cause transistors 31A and 31B to simultaneously conduct. This means that the positive pulses in $\phi 5$ and $\phi 6$ must be non-overlapping. Thus, it is seen that the circuit 10 performs a sample-hold function in transferring charge between the input node 21 and output node 22 so as to prevent feedthrough of the input signal voltage $v_s$ between these nodes.

An analytical description of the differential charge flow in the circuit 10 is readily obtained when the capacitances of C2 and C3 are the same value, i.e., C2=C3. The discrete time representation of differential charge caused in line 45 by C1 is $$\Delta q1(nT) = C1\{v1(nT-T) - v_s(nT-T/2)\} \quad (1)$$

Similarly, the differential charge caused there by C2 and C3 is $$\Delta q2(nT) = C2\{v1(nT) - v_s(nT-3T/2)\} \quad (2)$$

If the capacitance of C1 is also equal to that of C2, i.e., C1=C2=C3, then the net differential charge in line 45 is obtained by combining equations (1) and (2) and is representable as $$\Delta q(nT) = Co\{v1(nT) + v1(nT-T) - v_s(nT-T/2) - v_s(nT-3T/2)\} \quad (3)$$

Taking the z-transformation of equation (3), the net differential charge-voltage relationship for the circuit 10 in the z-domain is $$\Delta Q(z) = Co(1+z^{-1})\{V1(z) - V_s(z)z^{-\frac{1}{2}}\} \quad (4)$$

where z is the operator in the z-domain and the term $z^{-1}$ in the expression for voltage on the right side of equation (4) means that the circuit 10 provides a time delay of T/2 seconds for an input voltage at node 21. This has no effect on the frequency response of a filter connected to node 22 and driven by the circuit 10. The bilinear -z transformation is defined as $$s = \frac{2}{T} \frac{(z-1)}{(z+1)}. \tag{10}$$

The general representation of the differential charge-voltage relationship for a bilinear resistor is known to be $$\Delta Q(z) = \frac{T}{2R}(1 + z^{-1})V(z) \tag{5}$$

Comparison of equations (4) and (5) reveals that the circuit 10 simulates a bilinear source resistor having a resistance $R=T/2C$, where $C1=C=C3=Co=C$. The magnitude of the capacitance Co and the switching frequency are varied for changing the value of the bilinear resistance simulated by the circuit.

Although this invention is described in relation to preferred embodiments thereof, variations and modifications will occur to those skilled in the art. By way of example, the capacitances of C1, C2 and C3 may be different values or the same values, the capacitances of only C2 and C3 may be the same value, and the capacitance of either C2 or C3 may be zero for presenting an open circuit across it. It appears that the circuit 10 simulates a source resistor which is other than a bilinear resistor when the capacitances of C1, C2 and C3 are not all the same value. Also, the circuit 10 may be realized with integrated circuit technologies other than MOS and in other than fully integrated form. The circuit 10 may also be fully implemented with discrete components and with only a portion thereof in integrated circuit form. Further, the switch means may comprise other types of switching elements such as discrete transistors, mechanical switches, relays, and other types of integrated switches. Additionally, the durations of the enabling pulses in the control signals may be varied. Further, the time delays between the pulses in $\phi 3$ and $\phi 2$ and in $\phi 1$ and $\phi 4$ may be less than or greater than T seconds, although the circuit will no longer simulate a bilinear source resistor. The scope of this invention is therefore determined from the attached claims rather than from the aforementioned detailed descriptions of preferred embodiments thereof.

What is claimed is:

1. An integrated switched capacitor circuit for simulating a source resistor comprising:
   a first node for electrical connection to the output terminal of a voltage source that is associated with a ground reference potential;
   a second node;
   first and second capacitor means C1 and C2, each having a pair of terminals;
   voltage follower means having an input terminal electrically connected to said second node, which is adapted for connection to external circuitry, and having an output terminal electrically connected to one terminal of C1;
   first means electrically connecting one terminal of C2 to ground;
   first switch means periodically operative in first and second non-overlapping switch states for periodically electrically connecting the other terminal of C1 to said first and second nodes for charging and discharging C1, respectively; said first switch means being operative in each of said first and second switch states once during each T second time interval, where T is the difference between times of termination of adjacent first switch states and $f=1/T$ is the sampling frequency for C1; and
   second switch means periodically operative in third and fourth non-overlapping switch states for periodically connecting the other terminal of C2 to said first and second nodes for charging and discharging C2, respectively; said second switch means being operative for terminating a third switch state at a first time for causing C2 to sample the voltage at said first node, for causing C2 to hold the sampled voltage, and for subsequently operating in a fourth state for discharging C2;
   said circuit simulating a source resistor across said nodes when said first node is connected to the output terminal of a voltage source.

2. The circuit according to claim 1 comprising a third capacitor means C3 having one terminal electrically connected to ground and third switch means periodically operative in fifth and sixth non-overlapping switch states for periodically electrically connecting the other terminal of C3 to said first and second nodes for charging and discharging C3, respectively; said third switch means being operative for terminating a fifth switch state at a second time that is different from said first time for causing C3 to sample the voltage at said first node, for causing C2 to hold the sampled voltage, and for subsequently operating in a sixth state for discharging C3.

3. The circuit according to claim 2 wherein said second and third switch means are operative for causing C2 and C3 to hold a sampled voltage for at least a time interval T.

4. The circuit according to claim 3 wherein said second and third switch means terminate third and fifth switch states at generally the same times that said first switch means terminates associated first switch states.

5. The circuit according to claim 4 wherein said second switch means operates in a fourth switch state for discharging C2 prior to initiation of every other first switch state.

6. The circuit according to claim 5 wherein said third switch means operates in a sixth switch state for discharging C3 prior to initiation of alternate ones of the first switch state that are different from the aforementioned every other first switch states.

7. The circuit according to claim 6 wherein said third and fifth switch states correspond to adjacent first switch states that are separated by a time interval T, and said fourth and sixth switch states correspond to adjacent second switch states that are spaced generally 3T/2 from first switch states corresponding to associated third and fifth switch states.

8. The circuit according to claim 2 wherein the capacitances of C2 and C3 are the same value.

9. The circuit according to claim 8 wherein the capacitances of C1, C2 and C3 are all the same value C and the circuit simulates a bilinear source resistor having a resistance $R=T/2C$ between said nodes when the circuit is characterized by the bilinear transformation $$s = \frac{2}{T}\left(\frac{z-1}{z+1}\right),$$

where s is the Laplace operator, $f=1/T$ is the switching frequency, and z is the operator in the z-domain.

10. The circuit according to claim 2 or 9 wherein each of said capacitor means comprises an integrated capacitor and the one sides thereof are said bottom plates of the capacitors so that the circuit is substantially insensitive to bottom plate parasitic capacitance effects of the integrated capacitors.

11. An integratable switched capacitor circuit for simulating a source resistor comprising:
   a first node for electrical connection to the output terminal of a voltage source that is associated with a ground reference potential;
   a second node;
   first and second capacitors C1 and C2, each having a pair of terminal;
   voltage follower means having an input terminal electrically connected to said second node, which is adapted for connection to external circuitry, and having an output terminal electrically connected to one terminal of C1;
   first means electrically connecting one terminal of C2 to ground;
   first switch means periodically operative in first and second non-overlapping switch states, operation of said first switch means in the first state electrically connecting the other terminal of C1 to said first node for causing C1 to sample the difference voltage between said nodes, operation of said first switch means in the second switch state electrically connecting the other terminal of C1 to the second node for discharging C1; said first switch means being operative in the first and second switch states at different times during each T second time interval where T is the difference between times of termination of adjacent first switch states and $f=1/T$ is the sampling frequency for C1; and
   second switch means periodically operative in third and fourth non-overlapping switch states for periodically connecting the other terminal of C2 to said first and second nodes for charging and discharging C2, respectively; said second switch means being operative for terminating a third switch state at a first time that is the same time as termination of a first switch state for causing C2 to sample the voltage at said first node at the same time that C1 samples this voltage, for causing C2 to hold the sampled voltage for at least a time interval T, and for subsequently operating in a fourth state for discharging C2 prior to initiation of a succeeding first switch state;
   said circuit simulating a source resistor across said nodes when said first node is connected to the output terminal of a voltage source.

12. The circuit according to claim 11 comprising a third capacitor C3 having one terminal electrically connected to ground and third switch means periodically operative in fifth and sixth non-overlapping switch states for periodically electrically connecting the other terminal of C3 to said first and second nodes for charging and discharging C3, respectively; said third switch means being operative for terminating a fifth switch state at a second time spaced a time interval T from said first time so that C3 and C2 sample the voltage at said first node every other time interval T and at the same time that said first switch means terminates a first switch state at which C1 samples this voltage, for causing C3 to hold the sampled voltage for at least a time interval T following termination of a fifth switch state, and for subsequently operating in a sixth switch state for discharging C3 prior to initiation of the succeeding first switch state.

13. The circuit according to claim 12 wherein the capacitances of C2 and C3 are the same value.

14. The circuit according to claim 13 wherein the capacitances of C1, C2 and C3 are all the same value and the circuit simulates a bilinear source resistor having a resistance $R=T/2C$ between said nodes when the circuit is characterized by the bilinear transformation $$s = \frac{2}{T}\left(\frac{z-1}{z+1}\right),$$

where s is the Laplace operator, $f=1/T$ is the switching frequency, and z is the operator in the z-domain.

15. The circuit according to claim 12 or 14 wherein said capacitors are integrated capacitors and the one sides thereof are the bottom plates of the capacitors such that the circuit is substantially insensitive to bottom plate parasitic capacitance effects of the integrated capacitors.

* * * * *